United States Patent
Scanlan

(10) Patent No.: US 9,613,912 B2
(45) Date of Patent: Apr. 4, 2017

(54) METHOD OF MARKING A SEMICONDUCTOR PACKAGE

(71) Applicant: DECA Technologies Inc., Tempe, AZ (US)

(72) Inventor: Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 14/971,458

(22) Filed: Dec. 16, 2015

(65) Prior Publication Data

US 2016/0172306 A1    Jun. 16, 2016

Related U.S. Application Data

(60) Provisional application No. 62/092,322, filed on Dec. 16, 2014.

(51) Int. Cl.

| | |
|---|---|
| *H01L 21/46* | (2006.01) |
| *H01L 23/544* | (2006.01) |
| *H01L 21/78* | (2006.01) |
| *H01L 23/31* | (2006.01) |
| *H01L 23/00* | (2006.01) |

(52) U.S. Cl.
CPC ............ *H01L 23/544* (2013.01); *H01L 21/78* (2013.01); *H01L 23/3114* (2013.01); *H01L 24/19* (2013.01); *H01L 24/20* (2013.01); *H01L 24/96* (2013.01); *H01L 24/97* (2013.01); *H01L 2223/5442* (2013.01); *H01L 2223/54406* (2013.01); *H01L 2223/54413* (2013.01); *H01L 2223/54426* (2013.01); *H01L 2223/54433* (2013.01); *H01L 2223/54486* (2013.01); *H01L 2224/04105* (2013.01); *H01L 2224/12105* (2013.01); *H01L 2224/18* (2013.01);
(Continued)

(58) Field of Classification Search
CPC ................ H01L 2223/54426; H01L 2223/544
USPC .................................................. 438/455–459
See application file for complete search history.

(56) References Cited

U.S. PATENT DOCUMENTS

| | | | |
|---|---|---|---|
| 6,270,712 B1 * | 8/2001 | Shoji ..................... | B29C 33/424 249/103 |
| 8,415,260 B2 * | 4/2013 | Banach ................. | H01L 23/544 257/E23.179 |

(Continued)

FOREIGN PATENT DOCUMENTS

| | | |
|---|---|---|
| KR | 2010133699 | 12/2010 |
| TW | 506109 B | 10/2002 |
| WO | 2006124552 A2 | 11/2006 |

*Primary Examiner* — Julia Slutsker
(74) *Attorney, Agent, or Firm* — Booth Udall Fuller, PLC

(57) ABSTRACT

A method of making a semiconductor device can include providing a wafer comprising a plurality of semiconductor die, wherein each semiconductor die comprises an active surface and a backside opposite the active surface. A photosensitive layer can be formed over the wafer and on a backside of each of the plurality of semiconductor die within the wafer with a coating machine. An identifying mark can be formed within the photosensitive layer for each of the plurality of semiconductor die with a digital exposure machine and a developer, wherein a thickness of the identifying mark is less than or equal to 50 percent of a thickness of the photosensitive layer. The photosensitive layer can be cured. The wafer can be singulated into a plurality of semiconductor devices.

9 Claims, 9 Drawing Sheets

(52) U.S. Cl.
CPC *H01L 2224/73267* (2013.01); *H01L 2224/92* (2013.01); *H01L 2924/0002* (2013.01)

(56) References Cited

U.S. PATENT DOCUMENTS

| | | | | |
|---|---|---|---|---|
| 2005/0017353 | A1* | 1/2005 | Seddon | H01L 23/544 257/737 |
| 2005/0048681 | A1* | 3/2005 | Yang | G03F 7/0005 438/22 |
| 2010/0244287 | A1* | 9/2010 | Hsu | G03F 7/70633 257/797 |
| 2012/0195562 | A1* | 8/2012 | Tsujita | G02B 6/138 385/126 |
| 2013/0009319 | A1* | 1/2013 | Shao | B29C 43/18 257/774 |
| 2013/0049580 | A1* | 2/2013 | Maindron | H01L 51/56 313/512 |
| 2013/0140718 | A1 | 6/2013 | Banach et al. | |
| 2013/0280826 | A1* | 10/2013 | Scanlan | H01L 23/544 438/15 |
| 2015/0014709 | A1* | 1/2015 | Kim | H01L 27/124 257/88 |

* cited by examiner

METHOD OF MARKING A SEMICONDUCTOR PACKAGE

RELATED APPLICATIONS

This application claims the benefit of U.S. Provisional Application No. 62/042,183, filed Aug. 26, 2014, and further claims the benefit of U.S. Provisional Application No. 62/092,322, filed Dec. 16, 2014, the entirety of the disclosures of which are hereby incorporated by this reference.

TECHNICAL FIELD

The disclosure relates in general to semiconductor devices and packaging, and more particularly to identification, tracking, or both, of semiconductor packages and package components, such as semiconductor die, using package-level serialization.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. The term "semiconductor die" as used herein refers to both the singular and plural form of the words, and accordingly can refer to both a single semiconductor device and multiple semiconductor devices. During front-end manufacturing, or fabrication of semiconductor die on a native wafer, each semiconductor die is typically identical and contains circuits formed by electrically connecting active and passive components. Back-end manufacturing can involve singulating individual semiconductor die from the finished wafer and packaging the die to provide structural support and environmental isolation.

Individual semiconductor die and semiconductor packages can be marked with identifiers, such as by printing or laser marking on a backside of the semiconductor die or semiconductor package, to identify, track, or both, semiconductor die and semiconductor packages. As such, the marking of semiconductor die and packages can be done before singulation of the semiconductor die from the native semiconductor wafer, or after singulation and packaging in front-end manufacturing processes, back-end manufacturing processes, or both.

FIG. 1 shows an embodiment of a semiconductor package 2 comprising markings or identifiers 4 as known in the prior art. The markings 4 are formed on an outer surface of the package, such as in or on encapsulant or molding compound by printing or laser marking. The markings 4 can include alphanumeric characters, codes, and other symbols or designs that can include a notch 5 for identifying an orientation of the package 2, a pin identifier, dot, or circle 6 that can identify a first input/output (I/O) interconnect, such as a pin or other I/O interconnect. The markings 4 can also include one or more of a lot-trace code, a device mark, a logo, a date code, fab location, or other desirable information.

SUMMARY

The foregoing and other aspects, features, and advantages will be apparent to those artisans of ordinary skill in the art from the DESCRIPTION and DRAWINGS, and from the CLAIMS.

Accordingly, in one aspect, a method of making a semiconductor device can comprise providing a wafer comprising a plurality of semiconductor die, wherein each semiconductor die comprises an active surface and a backside opposite the active surface. A photosensitive layer can be formed over the wafer and on a backside of each of the plurality of semiconductor die within the wafer with a coating machine. An identifying mark can be formed within the photosensitive layer for each of the plurality of semiconductor die with a digital exposure machine and a developer, wherein a thickness of the identifying mark is less than or equal to 50 percent of a thickness of the photosensitive layer. The photosensitive layer can be cured. The wafer can be singulated into a plurality of semiconductor devices.

The method of making the semiconductor device can further comprise the wafer being a native semiconductor wafer, and the wafer being a reconstituted wafer or reconstituted panel. The identifying marks can be formed with a feature size less than or equal to 150 micrometers in length, width, or both. The photosensitive layer can be formed comprising a thickness in a range of 10-60 micrometers (μm), and the unique identifying marks can be formed with a thickness in a range of 2-30 μm. The photosensitive layer can be formed as a multi-film material comprising a non-photosensitive layer and a photosensitive layer, wherein a thickness of the photosensitive layer is less than or equal to a thickness of the non-photosensitive layer. The wafer can be formed with a diameter of about 300 millimeters, and the unique identifying mark for each of the plurality of semiconductor die can be formed at a rate equal to or greater than 25 wafers per hour (WPH) for wafers comprising a diameter of about 300 mm.

In another aspect, a method of making a semiconductor device can comprise providing a wafer comprising a plurality of semiconductor die, wherein each semiconductor die comprises an active surface and a backside opposite the active surface. A photosensitive layer can be formed over the wafer and over a backside of each of the plurality of semiconductor die within the wafer. An identifying mark can be formed in the photosensitive layer for each of the plurality of semiconductor die with a digital exposure machine and a developer. The photosensitive layer can be cured, and the wafer can be singulated into a plurality of semiconductor devices.

The method of making the semiconductor device can further comprise the wafer being a native semiconductor wafer, or a reconstituted wafer or reconstituted panel. The identifying marks can comprise a feature size less than or equal to 150 micrometers in length, width, or both. The photosensitive layer can be formed on the backside of each of the plurality of semiconductor die within the wafer. The photosensitive layer can be formed as a multi-film material comprising a non-photosensitive layer and a photosensitive layer. The identifying mark can be formed comprising a unique identifying mark for each of the plurality of semiconductor die. The coating machine for forming the photosensitive layer over the wafer an be a film laminator, a spin coater, a curtain coater, or a slot die coater.

In another aspect, a method of making a semiconductor device can comprise providing a wafer comprising a plurality of semiconductor die, wherein each semiconductor die comprises an active surface and a backside opposite the active surface. A photosensitive layer can be formed over the wafer each of the plurality of semiconductor die. An identifying mark can be formed with the photosensitive layer for each of the plurality of semiconductor die.

The method of making the semiconductor device can further comprise the wafer being a native semiconductor wafer, or a reconstituted wafer or reconstituted panel. The identifying marks can comprise a feature size less than or equal to 150 micrometers in length, width, or both. The photosensitive layer can be formed on the backside of each of the plurality of semiconductor die within the wafer. The photosensitive layer can be formed as a multi-film material comprising a non-photosensitive layer and a photosensitive layer. The identifying mark can be formed with a thickness less than or equal to 50 percent of a thickness of the photosensitive layer.

DETAILED DESCRIPTION

Figure 1:
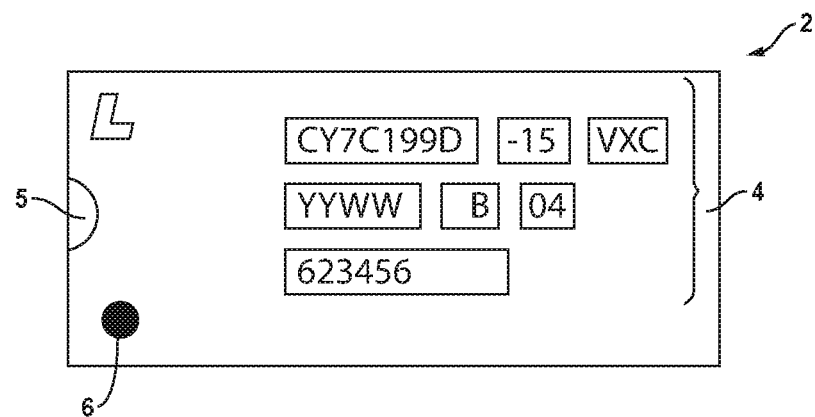
FIG. 1 illustrates markings on a semiconductor package as known in the prior art.

Embodiments of the disclosure disclose methods and systems to improve semiconductor packaging. This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation. In some instances, well-known processes and manufacturing techniques have not been described in particular detail in order to not unnecessarily obscure the disclosure. Furthermore, the various embodiments shown in the FIGs. are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support, environmental isolation, and package interconnect. To singulate the semiconductor die, the wafer is cut along non-functional regions of the wafer called saw streets or scribes. The wafer is singulated using a laser cutting tool or saw blade.

In some instances, after singulation the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material can be deposited over the package to provide physical support and electrical isolation. The finished package is then inserted into an electrical system and the functionality of the semiconductor device is made available to the other system components. Semiconductor packages using molding or a reconstituted wafer or panel include fan-out embedded die packages and fan-out wafer level packages (fo-WLPs). Examples of such processing are presented and discussed, for example, with respect to FIGS. 3A-4, and 9.

In other instances, such as wafer level packaging (WLP), wafer level chip scale packaging (WLCSP), or chip scale packaging (CSP), most or all package processing for structural support, environmental isolation, and package interconnect is done before the die is singulated. As used herein, WLP can refer to any semiconductor package in which a semiconductor die or integrated circuit has its packaging formed or built up on the native wafer, and the resulting package size or footprint is equal in size to size or footprint of the semiconductor die. As used herein, WLCSPs and CSPs refer to packages for single direct surface mountable semiconductor die, in which package size or footprint may be slightly larger than a size or footprint of the semiconductor die, with package size being greater than 1.0 times the size of the semiconductor die and being less than 1.2 times a size of the semiconductor die. Examples of such processing are presented and discussed, for example, with respect to FIGS. 5-8.

In some instances, semiconductor packaging may include laminating an epoxy film on the back of the wafer to provide mechanical protection. Conventionally, laser marking or printing has been used to create a readable mark on the backside laminate film in order to provide an identifying mark. The identifying mark may include a part number, date of manufacture, company logo, place of manufacture, or other desired information, as shown by identifying mark 4 in FIG. 1. As described below, an improved method of package marking may be used to improve on a conventional method of semiconductor package marking using lasers, printing, or both.

Figure 2A:
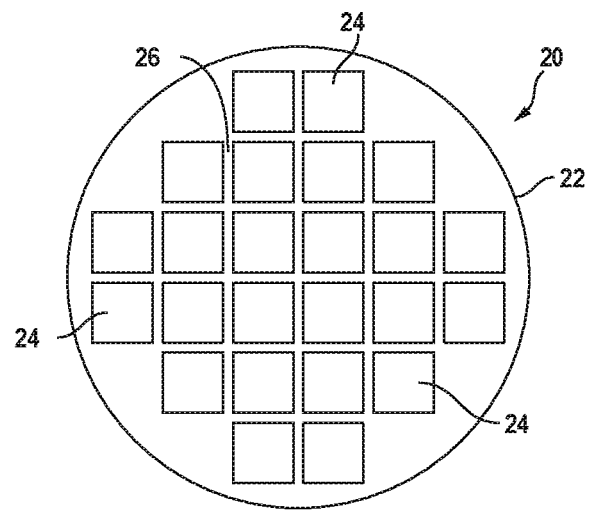
FIGS. 2A-2E illustrate a semiconductor wafer comprising a plurality of semiconductor die.

FIG. 2A shows a plan view of a native semiconductor wafer or semiconductor wafer 20 with a base substrate material 22, such as, without limitation, silicon, germanium, gallium arsenide, indium phosphide, or silicon carbide, for structural support. A plurality of semiconductor die or components 24 can be formed on wafer 20 separated by a non-active, inter-die wafer area or saw street 26 as described above. The saw street 26 can provide cutting areas to singulate the semiconductor wafer 20 into the individual semiconductor die 24.

Figure 2B:
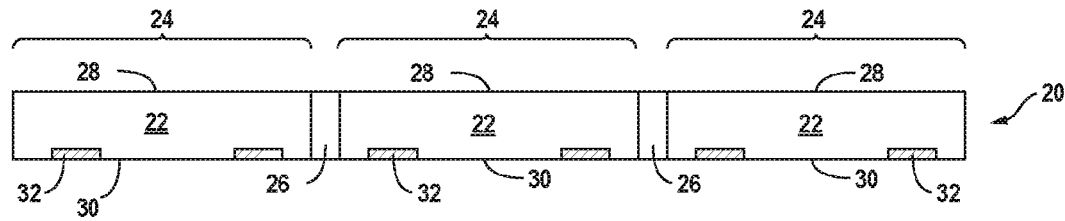

FIG. 2B shows a cross-sectional view of a portion of the semiconductor wafer 20 shown in FIG. 2A. Each semiconductor die 24 can comprise a backside or back surface 28 and an active surface 30 opposite the backside. The active surface 30 can contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface 30 to implement analog circuits or digital circuits, such as DSP, ASIC, memory, or other signal processing circuit. The semiconductor die 24 may also contain integrated passive devices (IPDs), such as inductors, capacitors, and resistors, for RF signal processing or other purposes. In an embodiment, the semiconductor die 24 can comprise a flip-chip type device.

An electrically conductive layer 32 can be formed over the active surface 30 using PVD, CVD, electrolytic plating, electroless plating process, or other suitable metal deposition process. The conductive layer 32 can be one or more layers of Al, Cu, Sn, Ni, Au, Ag, or other suitable electrically conductive material. The conductive layer 32 can operate as contact pads or bond pads electrically connected to the circuits on the active surface 30. The conductive layer 32 can be formed as contact pads disposed side-by-side a first distance from the edge of semiconductor die 24, as shown in FIG. 2B. Alternatively, the conductive layer 32 can be formed as contact pads that are offset in multiple rows such that a first row of contact pads is disposed a first distance from the edge of the die, and a second row of contact pads alternating with the first row is disposed a second distance from the edge of the die.

Figure 2C:
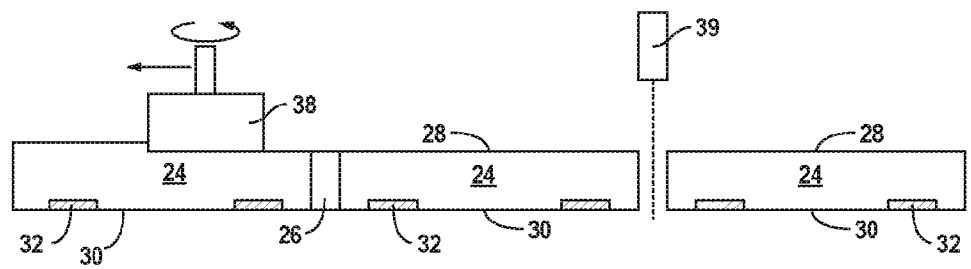

FIG. 2C shows the semiconductor wafer 20 can undergo an optional grinding operation with grinder 38 to planarize the backside or back surface 28 and reduce thickness of the semiconductor wafer 20. A chemical etch can also be used to remove and planarize the semiconductor wafer 20. The semiconductor wafer 20 can also be singulated through saw streets 26 using a saw blade or laser cutting tool 39 into individual semiconductor die 24.

Figure 2D:
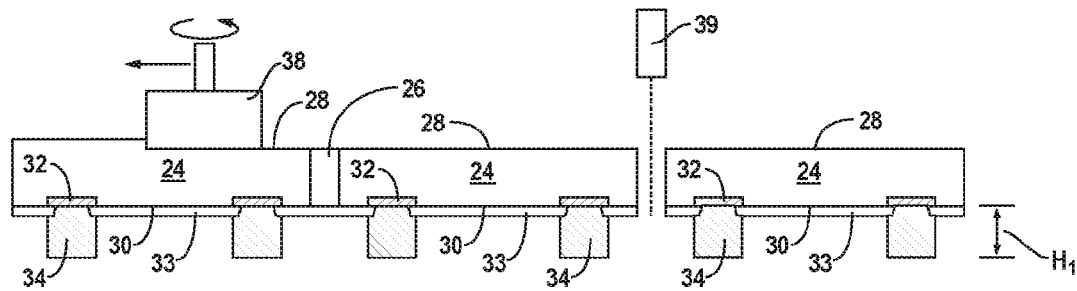

FIG. 2D, continuing from FIG. 2B, shows an insulating layer, passivation layer, or polymer layer 33 can be deposited to, and patterned on, native wafer 20, such as at active surface 30 of semiconductor die 24. The insulating layer 33 can contain one or more layers of a polymer material, photosensitive low curing temperature dielectric resist, photosensitive composite resist, laminate compound film, insulation paste with filler, solder mask resist film, liquid molding compound, silicon dioxide ($SiO_2$), silicon nitride ($Si_3N_4$), silicon oxynitride (SiON), aluminum oxide ($Al_2O_3$), or other material having similar insulating and structural properties. Insulating layer 33 can be deposited using printing, spin coating, spray coating, lamination, or other suitable process. Insulating layer 3 can be subsequently patterned and optionally cured to create space for subsequent electrical interconnects.

A portion of the insulating layer 33 can be removed by etching, laser drilling, mechanical drilling, or other suitable process to form openings. Openings can extend completely through the insulating layer 33 and expose contact pads 32 or any other portion of the semiconductor die 24 or native wafer 20. FIG. 2D shows a number of different openings through insulating layer 33 for subsequently formed conductive pillars, conductive posts, or conductive interconnects 34.

The conductive pillars 34 can be formed over, and connected to, contact pads 32. The conductive pillars 34 can be formed directly over or on the insulating layer 33 and the contact pads 32 using patterning and metal deposition processes such as printing, PVD, CVD, sputtering, electrolytic plating, electroless plating, metal evaporation, metal sputtering, or other suitable metal deposition process. The conductive pillars 34 can be one or more layers of Al, Cu, Sn, Ni, Au, Ag, or other suitable electrically conductive material. In an embodiment, a photoresist layer is deposited over semiconductor die 24 and conductive layer 32. A portion of the photoresist layer can be exposed and removed by an etching development process. The conductive pillars 34 can be formed as copper pillars, posts, or columns in the removed portion of the photoresist and over contact pads 32 using a selective plating process. The photoresist layer can be removed, leaving the conductive pillars 34 to provide for subsequent electrical interconnection and a standoff with respect to active surface 30 of the semiconductor die 24. In some embodiments, the conductive pillars 34 can include a height H1 in a range of 10-40 µm, 15-25 µm, or a height of about 20 µm.

The insulating layer 33 and the conductive pillars 34 can be formed on the native semiconductor wafer 20 before the semiconductor wafer 20 undergoes grinding and singulation with grinder 38 and saw blade or laser cutting tool 39 as described above with respect to FIG. 2D.

Figure 2E:
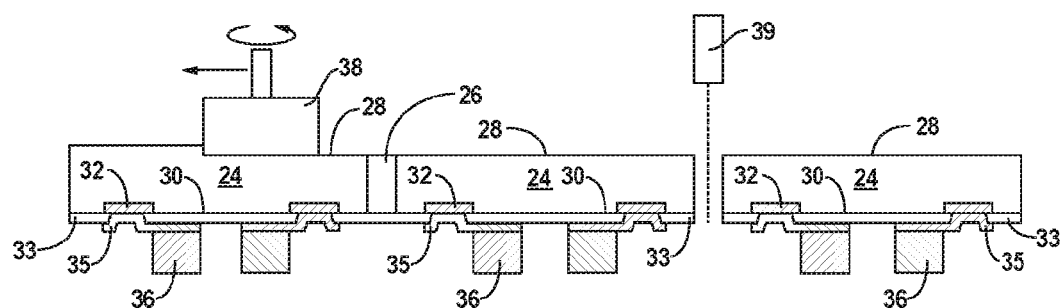

FIG. 2E, continuing from FIG. 2B, shows the insulating layer, passivation layer, or polymer layer 33 deposited to, and patterned on, native wafer 20, as described above with respect to FIG. 2D. FIG. 2E further shows conductive pillars, conductive posts, or conductive interconnects 36 that can be similar or identical to conductive posts 34 from FIG. 2D. The conductive posts 35 differ from the conductive posts 34 by being formed over, on, or in electrical contact with conductive layer 35 that can be formed as a fan-in redistribution layer (RDL) between the contact pads 32 and the conductive pillars 36.

The electrically conductive layer 35 can be deposited over, and in contact with, the openings in insulating layer 33, insulating layer 33, and contact pads 32. As a non-limiting example, the conductive layer 35 can be deposited using PVD, CVD, electrolytic plating, electroless plating, or other suitable process. The conductive layer 35 can comprise one or more layers of aluminum (Al), copper (Cu), tin (Sn), nickel (Ni), gold (Au), silver (Ag), titanium (Ti), tungsten (W), poly-silicon, or other suitable electrically conductive material.

The insulating layer 33, conductive layer 35, and the conductive pillars 36 can be formed on the native semiconductor wafer 20 before the semiconductor wafer 20 undergoes grinding and singulation with grinder 38 and saw blade or laser cutting tool 39 as described above with respect to FIG. 2D.

Figure 3A:
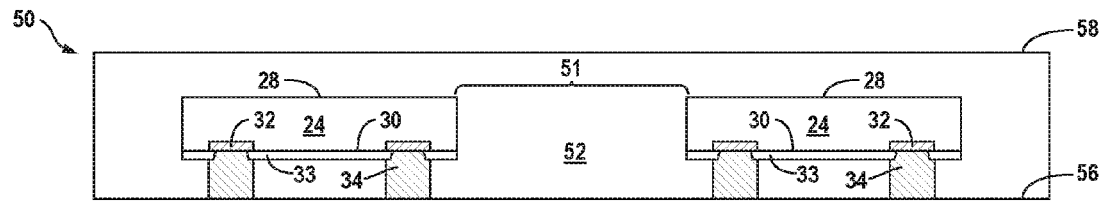
FIGS. 3A-3F illustrate aspects of semiconductor packages with an identifying mark, and a method of providing the identifying mark.
Figure 3B:
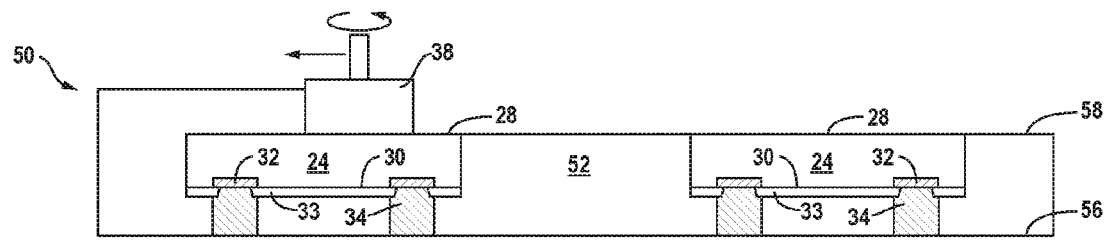
Figure 3C:
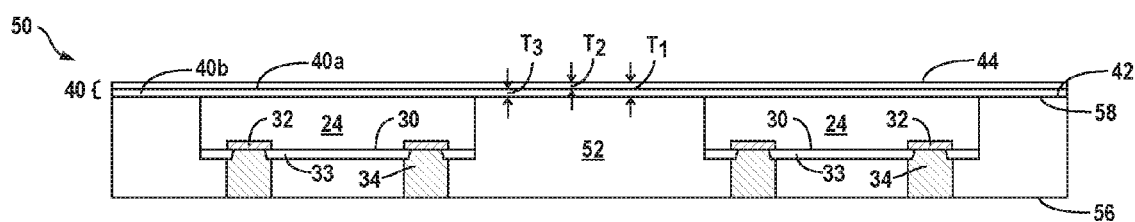
Figure 3D:
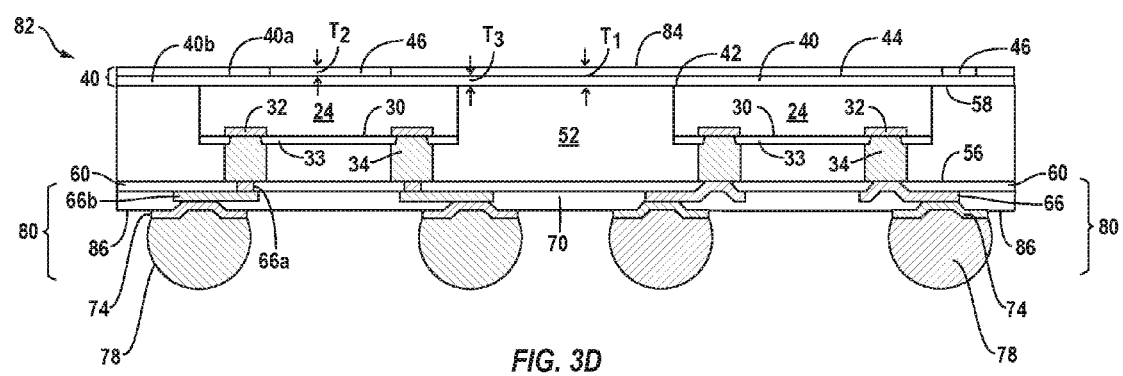
Figure 3E:
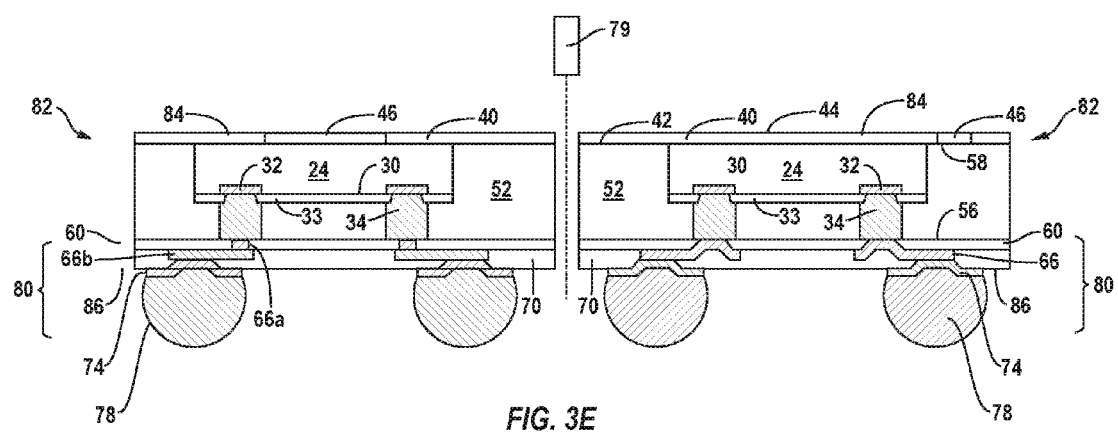

FIG. 3A shows a reconstituted wafer or panel 50 comprising a plurality of semiconductor die 24 from FIG. 2D that are used in the formation of the package, semiconductor package, semiconductor device, fo-WLCSP, or fo-embedded die package 82 shown in FIG. 3E. FIG. 3A further shows an encapsulant or mold compound 52 disposed around the plurality of semiconductor die 24. The encapsulant 52 can be deposited using a paste printing, compression molding, transfer molding, liquid encapsulant molding, vacuum lamination, film-assisted molding, or other suitable applicator.

Encapsulant 52 can be polymer composite material, such as epoxy resin with filler, epoxy acrylate with filler, or polymer with proper filler. Encapsulant 52 can be non-conductive, provide physical support, and environmentally protect the semiconductor device from external elements and contaminants.

The encapsulant 52 can contact, cover, and be disposed over or adjacent, all six sides, or all sides of the semiconductor die 24, including the backside 28, the active surface 30, and all of the side surfaces of the connect or extend between the backside 28 and the frontside 30. A bottom surface or first surface 56 of the reconstituted wafer 50 can comprise a bottom surface of encapsulant 52 that can be coplanar or substantially coplanar with a bottom surface or end of the copper pillars 34. A top surface or second surface 58 of the reconstituted wafer 50 can be disposed opposite the first surface 56 and be disposed over the backside 28 of the semiconductor die 24. The top surface 58 of the reconstituted wafer 50 can be over and offset from, or coplanar with, the backside 28 of the semiconductor die 24 as shown, for example, in FIGS. 3A, 3B, and 9.

In some embodiments, the encapsulant 52 can be disposed around the semiconductor die 24 while the semiconductor die are mounted, such as face down, to a temporary carrier or substrate that can contain a temporary or sacrificial base material such as silicon, polymer, beryllium oxide, or other suitable low-cost, rigid material for structural support. An optional interface layer or double-sided tape can be disposed over a top surface of the temporary carrier and between the plurality of semiconductor die 24 and the temporary carrier as an adhesive bonding film. The carrier and interface layer can be removed by chemical etching, mechanical peeling, CMP, mechanical grinding, thermal bake, UV light, laser scanning, or wet stripping. FIG. 3A shows a non-limiting example of the reconstituted wafer 50 after removal of the temporary carrier and the interface layer so that bottom surface 56 of the reconstituted wafer 50 is exposed and ready for subsequent processing as described in greater detail below.

Semiconductor die 24 are shown in FIG. 3A as being separated by a space or gap 51 within the reconstituted wafer 50. Gap 51 can provide an area for a subsequently formed fan-out interconnect structure. A size of gap 51 can be determined according to a panel design and provide sufficient space for fan-out wafer level packages fo-WLPs, and for fan-out interconnect structures or redistribution layers (RDLs) to be formed around each semiconductor die 24. Gap 51 can also include sufficient area for optionally mounting other semiconductor devices or components adjacent the semiconductor die 24 for inclusion within a final semiconductor die package 82. The other devices or components can include discrete devices, distributed components, or passive devices including inductors, capacitors, and resistors. In any event, gap 51 can include sufficient space between the semiconductor die 24 to provide adequate space for the subsequent singulation of the semiconductor 24 from the reconstituted wafer 50.

Encapsulant 52 can be formed and deposited around the plurality of semiconductor die 24 using a paste printing, compressive molding, transfer molding, liquid encapsulant molding, vacuum lamination, spin coating, or other suitable applicator. Encapsulant 52 can be evenly dispersed and uniformly distributed under an elevated temperature around semiconductor die 24, and a viscosity of the encapsulant 50 can be selected for uniform coverage. A plurality of the semiconductor die 24 can be embedded together in encapsulant 52, which can be non-conductive and environmentally protect the semiconductor device from external elements and contaminants. The encapsulant 52 can be disposed around the semiconductor die 24 to form a reconstituted wafer 50 that includes a footprint or form factor of any shape and size that allows for, and facilitates, the subsequent processing required to form the desired semiconductor die packages. As a non-limiting example, the reconstituted wafer 52 can comprise a form factor similar to the form factor of a 300 millimeters (mm) semiconductor wafer and includes a circular footprint having a diameter of 300 mm, or about 300 mm, i.e. plus or minus 5 mm. Similarly, circular footprints of any desirable diameter can also be formed. As another non-limiting example, the reconstituted wafer 50 can comprise a strip of semiconductor die 24 that comprise a square footprint, rectangular footprint, or any other desirable footprint.

FIG. 3B shows the reconstituted wafer 50 can undergo an optional grinding operation with grinder 38 to planarize top surface 58 of the reconstituted wafer 50, and to expose the back surfaces 28 of semiconductor die 24 so that the back surfaces 28 are coplanar with the top surface 50 of the reconstituted wafer 50. A chemical etch can also be used to remove and planarize the reconstituted wafer 50. The removal of material and planarization of the reconstituted wafer 50 can also reduce a height of the reconstituted wafer 50 and the resulting semiconductor packages 82.

FIG. 3C shows that after the formation of reconstituted wafer 50, a layer of photosensitive or photoimagable material 40 can be formed over the top surface 58 of the reconstituted wafer 50. While the photosensitive material 40 is shown being disposed over the reconstituted wafer 50, the photosensitive material 40 can also be placed over native wafers or other structure or arrangements of semiconductor devices that would also benefit from the marking described herein. Examples of the photosensitive material 40 being formed over the native wafer 20 are shown in, and discussed with respect to, FIGS. 5-8. The layer of photosensitive material 40 can comprise a bottom surface or first surface 42 that can extend along, and follow a contour of, the top surface 58 of the reconstituted wafer 50. The layer of photosensitive material 40 can also comprise a top surface or second surface 44, opposite the bottom surface 42, that can extend along, and follow a contour of, the bottom surface 42. The photosensitive material 40 can comprise an epoxy material, a polymer material, or other suitable material, and can be formed in a film, sheet, or layer, using any suitable method for applying a photosensitive material. A non-limiting example, the photosensitive material 40 can also include solder masks and dry film solder masks, such as Hitachi FZ2700-GA. As discussed in greater detail below, the photosensitive material 40 can be applied to, or disposed on, the back of a plurality of semiconductor packages, such as those included within the unsingulated reconstituted wafer 50, as part of a method for increasing efficiency of placing identifying marks on semiconductor devices by increasing process throughput for package marking, reducing marking process cost, improving marking consistency, and providing for reduced character or symbol size.

In some instances the photosensitive material 40 can be formed as a single or monolithic layer of material or film. In other instances, the photosensitive material 40 can also be formed of more than one material or layer, such as a multi-layer material or film. For example, the photosensitive material 40 can also be formed as a multi-layer film comprising a photosensitive layer 40a formed over a non-photosensitive layer 40b. For ease of presentation, the photosensitive material 40 is sometime shown as a multi-layer material comprising layers 40a and 40b, while at other times being shown as a single layer 40, with the understanding the a single-layer or multi-layer structure can be used whenever the layer 40 is indicated. When the photosensitive material 40 is formed as a multi-layer film, the non-photo sensitive layer 40b can be adhered directly to the top surface 58 of the reconstituted wafer 50, the backside 28 of semiconductor die 24, or both. The photosensitive material 40a can be positioned over, or disposed on, the non-photosensitive layer 40b. After exposure of the photosensitive material 40, an entire thickness of the photosensitive portion of the photosensitive material 40 can be selectively removed to create an identifying mark 46. In some instance an entire thickness of the photosensitive material 40 will be removed, while in other instances less than an entirety of the photosensitive material 40 will be removed, leaving a portion fo the photosensitive layer 40, such as the non-photo sensitive layer 40b intact and covering an entirety of the top surface 58, the backsides 28, or both. A thickness T2 of the photosensitive layer 40a or the identifying mark 46 may be less than or equal to 50 percent of a thickness T1 of the photosensitive layer 40 (i.e. 40a and 40b). In some instances, the thickness T2 of the photosensitive layer 40a is less than or equal to a thickness T3 of the non-photosensitive layer 40b.

FIG. 3D shows that after the formation or placement of the photosensitive material 40 on, over, or in contact with the top surface 58 of the reconstituted wafer 50, including backsides 28, one or more identifying marks 46 can be formed in the photosensitive material 40. In some embodiments, the plurality of identifying marks 46 can be formed in the photosensitive material 40 using a programmable, maskless pattering system. Each of the identifying marks 46 formed on the reconstituted wafer 50 can correspond to a particular semiconductor die, package, or semiconductor device. The identifying marks 46 can comprise one or more features 45, including text, letters, shapes, symbols, logos, alphanumeric sequences, two-dimensional matrix codes, bar codes, QR codes, IR codes, pin 1 identifiers, or any other identifying mark or image that can be machine-readable or human-readable. The features 45 may include a feature size less than or equal to 150 μm in length, width, or both.

Formation of the identifying marks 46 can be accomplished, at least in part, by using a digital exposure machine, a maskless patterning machine, a laser direct imaging machine, or other similar machine. As a non-limiting example, using a laser direct imaging machine, a pattern can be exposed on the photosensitive material 40, which can include a photopolymer film. By way of illustration and not by limitation, a wavelength of light used to expose the polymer film can be between 350 nanometers (nm) and 410 nm. After exposure of the photosensitive material 40, the patterned or exposed photosensitive material 40 can be partially or completely developed to form the identifying marks 46 within the photosensitive material 40.

The patterned film can then be partially chemically developed so that openings, recesses, depressions, indentations, voids, or cavities can be formed in the photosensitive material 40 to form the identifying mark 46, which can include one or more features 45 over the top surface 58 of the reconstituted wafer 50, over the backsides 28, or both.

After patterning and development of the photosensitive material 40 and production of the accompanying identifying mark 46, the photosensitive material 40 can then be cured to increase the hardness of the material. Curing of the photosensitive material 40 can be accomplished with one or more of thermal curing, UV curing, microwave curing, or other suitable curing. The size of the features 45 of the identifying mark 46 produced by patterning and developing can comprise dimensions, including length and width, less than dimensions of conventional marking technologies, such as laser ablation, ink printing, and ink jetting. In some embodiments, the size of the features 45 produced by patterning and developing can be less than or equal to 150 μm, less than or equal to 100 μm, and less than or equal to 50 μm in length, width, or both. The identifying mark 46 can also be formed with a pixel size less than or equal to 50 μm.

Each of the identifying marks 46 can serve as an identifying mark or unique identifying mark for each unit on or in the reconstituted wafer 50. The identifying marks 46 can encode or comprise unique identifying information for a particular semiconductor die 24, such as the type of product, product capabilities, and product manufacturing information such as the location of the semiconductor die 24 or its package within a native wafer 20 or reconstituted wafer 50, a unique wafer identification (ID) number, as well as information relating to one or more of a time, date, or location of manufacturing of the semiconductor die 24 or its package 82, as well as other desirable information. As such, the identifying mark 46 can provide a machine-readable mark comprising information that can be unique for each semiconductor die, semiconductor package, or unit of the reconstituted wafer 50, including a wafer identification (ID) number and a position of the unit on the wafer or panel. The identifying marks 46 can also communicate information about package type, origin, orientation, and wafer position. For example, in order to uniquely identify each of the packages 82, positional information such as x-y coordinates for package position within the reconstituted wafer 52 can be included on the package 82, in addition to other identifying information.

The identifying marks 46 can be fully formed or partially formed in the photosensitive layer 40. The identifying marks 46 can be fully formed in the photosensitive layer 40 when the identifying marks 46 are formed by selectively removing a full thickness of the photosensitive layer 40 in certain areas to create the openings. In other words, the identifying marks 46 can extend completely through the photosensitive material 40, such as from the top surface 44 to the bottom surface 42. Alternatively, only a partial thickness of the photosensitive material 40 can be removed, leaving a continuous layer of the photosensitive material 40 (such as non-photo sensitive layer 40b or other portion of photosensitive material 40) covering the top surface 58 of the reconstituted wafer 50, backside 28, a top surface of the semiconductor package 82, or the top surface of the encapsulant 52. In instances when the photosensitive material 40 comprises a negative acting film, the portion of the photosensitive material 40 that is exposed will cross link, rendering it resistant to the developer, such as sodium carbonate or other suitable agent. In instances when the photosensitive material 40 is a positive acting film, the portion of the photosensitive material 40 that is exposed can be rendered soluble in the developer, such as tetramethylammonium hydroxide (TMAH) or other suitable agent. Partial development of the photosensitive material 40 can be achieved by optimizing the exposure and development processes, including the exposure energy, focus, develop time, develop temperature, and developer solution concentration.

In the case of a negative active film, the expose process may be optimized to partially expose the photosensitive film in the region of the mark causing cross-linking to occur in a partial thickness of the film. This can be accomplished by increasing the exposure energy, or by defocusing the image resulting in a lower exposure dose in the region of the mark. In the case of a positive acting material, the exposure energy may be reduced to expose only a partial thickness of the film in the region of the mark. A thickness or depth T2 of the identifying marks 46 created by partial development of the photosensitive material 40 can vary, and in some embodiments can be in a range of, or about, 2-30 μm in order to optimize readability of the identifying mark 46. A thickness or depth T1 of the photosensitive material 40 between the top surface 44 and the bottom surface 42 can be greater than the thickness T2 of the identifying mark 46, and can be in the range of, or about, 10-60 microns.

In instances when an identifying mark 46 will be covered by additional packaging, such as an additional insulting or protective layer, the insulating layer can comprise a transparent or translucent material to allow for the identifying marks 46 to be optically recognized and read even when included within the semiconductor package while being disposed away from an external or exposed surface of the semiconductor package. In other instances, the identifying marks 46 can provide high optical contrast by filling the mark with a material of a different color, including a metal, plastic, or other suitable material, to make the mark 46 more legible. Optical contrast can also be achieved by removing enough material from photosensitive layer 40 that a different colored material, or different material or layer, such as non-photo sensitive layer 40b, or backside 28 of semiconductor die 24 are exposed to increase contrast and make the identifying mark 46 more easily recognized or read.

By forming a plurality of identifying marks 46 within photosensitive material 40 as described herein, a number of advantages are realized with respect to conventional package marking on a backside of a semiconductor package or semiconductor device using laser marking or ink printing.

First, package marking with laser marking or ink printing is a sequential process that is often slow and capital intensive. For example, a 300 millimeter (mm) WLCSP may have thousands of individual die units each with several lines of alpha numeric characters and other symbols for each. As a result a single wafer can require inscription of about 300,000 characters or symbols per wafer. Such an inscription can typically require an hour or more of laser marking which can result in high capital costs and long manufacturing cycle times. In instances when character size is reduced to increase a number of characters on the wafer, such as to provide additional information, the increased number of characters further increases time and cost of marking. To the contrary, formation of the identifying mark 46 in photosensitive material 40 for each semiconductor die 24 can be done at a same time and during a same processing step by using custom light patterns to allow for the addition of the identifying marks 46 without increasing processing time, as with laser marking. Stated another way, the process time for making a wafer with identifying marks 46 is independent of a mark density or a number of marks or characters used in identifying marks 46, which can greatly decrease processing time and associated cost. Additionally, whereas logos or logo marks included as part of a laser mark could often be slow, time intensive, and of poor quality, when logos and logo marks are formed as part of identifying marks 46, the size or detail of a mark, and a quality of the mark, do not increase processing time for creating the marks because of forming marks 46 within the photosensitive material 40.

Second, rework of a faulty, incomplete, or otherwise deficient identifying mark 46 is possible with using photosensitive material 40 that would otherwise be unavailable with laser ablation. With laser ablation, rework is not practically possible because a portion of the film that should have remained has been laser ablated. Typically laser marking of an epoxy film is done after cure and there is no way to remove the film after cure, the film being permanently attached to the package. Even before cure it is very difficult to remove the film once it is laminated to the wafer. With the positive photo process, the film can be fully imaged and developed away at any time before the film is thermally cured. For example, after exposure and development of a positive acting film the image can be inspected, such as by an automated optical inspection (AOI) machine. If an error is detected, the error can be remedied by exposing the entire wafer rendering the entire film soluble in developer. The film can then be developed away and reapplied and a new marking process performed to provide identifying marks 46 without errors.

Third, laser marking can be a difficult process to control in high volume manufacturing, which can result in defects such as broken marks, missing marks, misaligned marks, faded marks, or excessively deep marks. These defects can render the markings unreadable and therefore result in expensive scrap or wasted material. Furthermore, varying depths of laser penetration can result in exposure in different layers and different materials that can result in variations in contrast that undesirably lead to diminished legibility.

Fourth, another limit to controlling the use of laser marking relates to a size of the characters made by laser ablation. As known in the art, a practical minimum size of characters made by laser marking has a practical limit of about 150 µm. The minimum character size for laser marking limits is influenced by the increasing time required for laser marking as the character size is reduced to include more characters because of the sequential nature of the laser ablation process. The minimum character size for laser marking also limits an amount of information that can be encoded on the back of the package, especially for very small packages. Similarly, the use of ink marking can have the disadvantage of limited character size and resolution, additional material cost, and slightly increased package thickness. Additionally, printing quality can be difficult to control and quality problems can be common. To the contrary, formation of identifying marks 46 within photosensitive material 40 as disclosed herein allows for a minimum character size less than 150 µm, less than 100 µm, and less than or equal to 50 µm in length, width, or both.

In addition to showing formation of the identifying mark 46 in photosensitive material 40, FIG. 3D also shows the formation of a build-up interconnect structure 80, such as a fan-out build-up interconnect structure, over reconstituted wafer 50. The formation of the build-up interconnect structure 80 can occur before or after the formation or placement of photosensitive material 40, and before or after the formation of the identifying mark 46 in the photosensitive material 40. While a non-limiting example of the build-up interconnect structure 80 is described and shown with respect to FIG. 3D, additional layers, configurations, and designs are also contemplated for the build-up interconnect structure 80.

As such, the build-up interconnect structure 80 can comprise deposition and patterning of insulating or passivation layer 60. Insulating layer 60 can be applied to reconstituted wafer 50, such as at bottom surface 56 of the reconstituted wafer 50, either before or after removal of the temporary carrier to which the semiconductor die 24 are mounted. The insulating layer 60 can be conformally applied to, and have a first surface that follows the contours of, the reconstituted wafer 50, including encapsulant 50 and semiconductor die 24. Insulating layer 60 can comprise a second planar surface opposite the first surface. The insulating layer 60 can contain one or more layers of photosensitive low curing temperature dielectric resist, photosensitive composite resist, laminate compound film, insulation paste with filler, solder mask resist film, liquid molding compound, $SiO_2$, $Si_3N_4$, SiON, $Al_2O_3$, or other material having similar insulating and structural properties. Insulating layer 60 can be deposited using printing, spin coating, spray coating, lamination, or other suitable process. Insulating layer 60 can be subsequently patterned and optionally cured to create space for subsequent electrical interconnects.

A portion of the insulating layer 60 can be removed by etching, laser drilling, mechanical drilling, or other suitable process to form openings. Openings can extend completely through the insulating layer 60 and expose contact pads 32 or any other portion of the semiconductor die 24 or reconstituted wafer 50. FIG. 3D shows a number of different openings 62 for subsequently formed conductive vias and electrical interconnects.

FIG. 3D also shows an electrically conductive layer 66 can be deposited in the openings, as well as being deposited over and in electrical contact with contact pads 32, and over and extending across portions of insulating layer 60 to form an RDL. As a non-limiting example, the conductive layer 66 can be deposited using PVD, CVD, electrolytic plating, electroless plating, or other suitable process. The conductive layer 66 can comprise one or more layers of Al, Cu, Sn, Ni, Au, Ag, Ti, W, poly-silicon, or other suitable electrically conductive material.

In some embodiments, the conductive layer 66 can be formed comprising two different parts or portions, namely a conductive via 66a and an RDL trace 66b. The conductive via 66a can form part of the build-up interconnect structure and provide vertical electrical connection between contact pads 32 and RDL trace 66b. As shown in FIG. 3D, the RDL trace 66b can be conformally applied to the second surface of the insulating layer 60 and to a surface of the conductive via 66a that is co-planar or substantially co-planar with the surface of the conductive via 66a. In some cases the conductive via 66a and the RDL trace 66b can be formed at a same time or during a same processing step, while in other cases the conductive via 66a and the RDL trace 66b can be formed at different times or as part of different processing steps. In either event, the conductive layer 66b can extend across the second surface of the insulating layer 60 and across the conductive via 66a, so that the conductive layer 66b can be oriented parallel or substantially parallel to bottom surface 56 of the reconstituted wafer 50.

The conductive layer 66 can also be formed without a conductive via 66a, and be formed as an RDL 66 that is conformally applied to the insulating layer 60 and the contact pad 32. As such, the conductive layer can extend across the second surface of the insulating layer 60 parallel or substantially parallel to bottom surface 56 of the reconstituted wafer 50, and also follow a contour or slope of sidewalls of the openings exposing the contact pad 32, as well as extend along a bottom of the openings 63D at an interface, or in contact with, contact pads 32. The conductive layer 66, as shown in FIG. 3D, can form part of the build-up interconnect structure that can provide both vertical and horizontal electrical connection with contact pads 32.

FIG. 3D also shows an insulating or passivation layer 70 that is conformally applied to, and comprises a first surface that follows the contours of, insulating layer 60 and conductive layer 66. Insulating layer 70 further comprises a second planar surface opposite the first surface. Insulating layer 70 can comprise one or more layers of photosensitive low curing temperature dielectric resist, photosensitive composite resist, laminate compound film, insulation paste with filler, solder mask resist film, liquid molding compound, SiO2, Si3N4, SiON, Al2O3, or other material having similar insulating and structural properties. Insulating layer 70 can be deposited using printing, spin coating, spray coating, lamination, or other suitable process. Insulating layer 70, like insulating layer 60, can also comprise a transparent or translucent material to allow for optical recognition of identifying marks 46 through the insulating material. Insulating layer 70 can also be subsequently patterned and optionally cured.

A portion of insulating layer 70 can be removed by etching, laser drilling, mechanical drilling, or other suitable process to form openings that extend completely through insulating layer 70 and expose a portion of conductive layer 66. An electrically conductive layer can be deposited in the openings in insulating layer 70 and in contact with conductive layer 66 using PVD, CVD, electrolytic plating, electroless plating, or other suitable process to form under bump metallization (UBM) pads 74. UBM pads 74 can be multiple metal stacks including adhesion, barrier, seed, and wetting layers. Layers of UBM 74 can be Ti, titanium nitride (TiN), titanium tungsten (TiW), Al, Cu, chromium (Cr), chromium copper (CrCu), Ni, nickel vanadium (NiV), palladium (Pd), platinum (Pt), Au, and Ag. As a non-limiting example, UBM pads 74 can comprise a TiW seed layer, a Cu Seed layer, and a Cu UBM layer. The TiW seed layer can be conformally applied over insulating layer 70 and conductive layer 66. The Cu seed layer can be conformally applied over the TiW seed layer. The Cu UBM layer can be conformally applied over the TiW seed layer and the Cu seed layer. UBM pads 74 act as an intermediate conductive layer between conductive layer 66 and subsequently formed solder bumps or other I/O interconnect structures. UBM pads 74 can provide a low resistive interconnect to conductive layer 66, a barrier to solder diffusion, and an increase in solder wettability.

An electrically conductive bump material can be deposited over UBM pads 74 and conductive layer 66 using an evaporation, electrolytic plating, electroless plating, ball drop, screen printing, or other suitable process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to UBM pads 74 using a suitable attachment or bonding process. In an embodiment, the bump material can be reflowed by heating the material above its melting point to form spherical balls or bumps 78. In some applications, bumps 78 are reflowed a second time to improve electrical contact to UBM pads 74. The bumps can also be compression bonded to UBM pads 74. Bumps 78 represent one type of interconnect structure that can be formed over UBM pads 74. The interconnect structure can also comprise conductive paste, stud bump, micro bump, or other electrical interconnect. Taken together, the insulating or passivation layer 60, the conductive layer 66, the insulating or passivation layer 70, the UBM pads 74, and the bumps 78 can form build-up interconnect structure 80 that provides for electrical connection and distribution of electrical signals throughout a semiconductor package or semiconductor device 82 according to the configuration and design of the semiconductor package 82. As such, the build-up interconnect structure is not limited to the specific number or type of layers that have been included as non-limiting examples, but can additionally comprise more layers or fewer layers to provide the desired interconnection.

FIG. 3E shows that after the formation of build-up interconnect structure 80 and formation a the identifying marks 46 within photosensitive material 40, reconstituted wafer 50 can be singulated using a saw blade or laser cutting tool 79 to form semiconductor packages 82. The semiconductor package 82 can comprise a backside or first surface 84 that is disposed over the backside 28 of the semiconductor die 24. The semiconductor package 82 can also comprise a frontside or second surface 86 that is disposed over the active surface 30 of the semiconductor die 24.

Figure 3F:
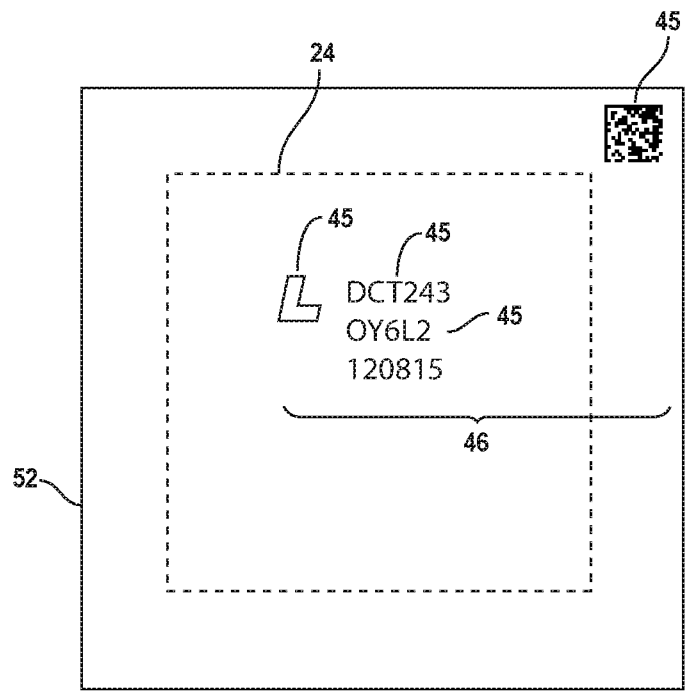

FIG. 3F shows a plan view of a semiconductor package 82 directed towards the backside 84 of the semiconductor package 82. As such, FIG. 3D shows the semiconductor die 24 encased with the encapsulant 52 and the identifying mark 46 comprising a plurality of features 45 included within photosensitive material 40 and exposed at a backside 84 of the semiconductor package 82. The identifying mark 46 can be at an external or exterior surface of the semiconductor package 82 to be visible and readable by optical inspection for communication of the information stored, linked, or presented by the identifying mark 46. Alternatively, the identifying mark 46 can be positioned away from an external or exterior surface of the semiconductor package 82 and embedded within the semiconductor package 82. When the identifying mark 46 is embedded within the semiconductor package 82, those layers or materials disposed over the identifying mark can be translucent or transparent to allow for the identifying mark to be visible and readable by optical inspection for communication of the information stored, linked, or presented by the identifying mark 46.

Figure 4:
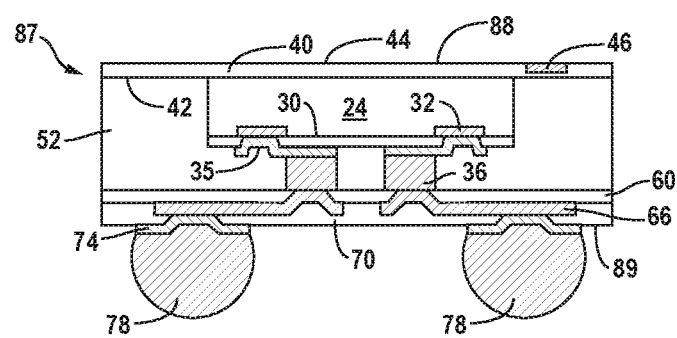
FIG. 4 illustrates an embodiment of a semiconductor package comprising an identifying mark.

FIG. 4 shows a cross-sectional profile view of a semiconductor package or semiconductor device 87 similar to semiconductor package 82, where like reference numbers represent similar or identical structures and materials made by the same or similar processes. Semiconductor package 87 comprises a backside or first surface 88 and a frontside or second surface 89 opposite the first surface 88. Semiconductor package 87 differs from semiconductor package 82 by inclusion of semiconductor die 24 from the semiconductor wafer 20 shown in FIG. 2E, where the fan-in RDL 35 is patterned over the semiconductor die 24 before formation of the conductive pillars 36. As such, semiconductor package 87 illustrates another exemplary package structure that can benefit from identifying marks 46 being formed in the photosensitive material 40 disposed over, and in contact with, the backside 28 of semiconductor die 24.

FIGS. 5-8 each show instances in which WLPs can be formed by a method of marking a semiconductor package with identifying marks 46 in the photosensitive material 40. Each of the semiconductor die 24 can comprise a unique identifying mark 46 that records source identifying information for each of the semiconductor die 24, such as a position within the semiconductor wafer 20 before singulation. In other instances, the identifying marks 46 need not be unique, but can contain or convey other relevant information about the package.

Figure 5:
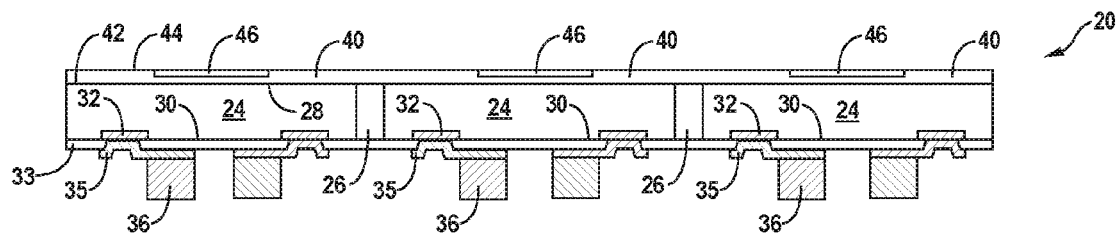
FIG. 5 illustrates an embodiment of a wafer comprising a plurality of semiconductor packages comprising identifying marks.

FIG. 5, continuing from FIG. 2E, shows the native semiconductor wafer 20 with fan-in RDLs 35 and conductive pillars 36 before singulation of the native wafer 20. FIG. 5 shows the native wafer 20 at a point during formation of WLPs in which a plurality of semiconductor packages or devices have been marked with identifying marks 46 in the photosensitive material 40, as described in above.

Figure 6:
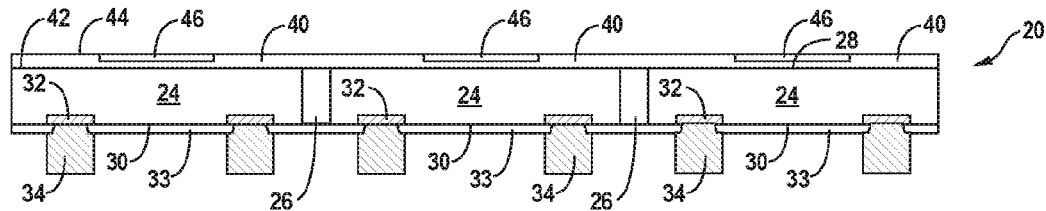
FIG. 6 illustrates an embodiment of a wafer comprising a plurality of semiconductor packages comprising identifying marks.

FIG. 6, continuing from FIG. 2D, shows the native semiconductor wafer 20 without fan-in RDLs, and with conductive pillars 34 before singulation of the native wafer 20. FIG. 6 shows the native wafer 20 at a point during formation of WLPs in which a plurality of semiconductor packages or devices have been marked with identifying marks 46 in the photosensitive material 40, through the method of marking described above.

Figure 7:
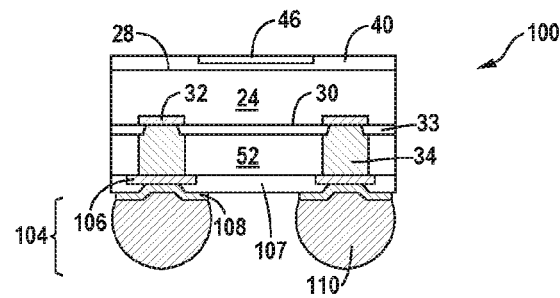
FIG. 7 illustrates an embodiment of a semiconductor package comprising an identifying mark.

FIG. 7, continuing from FIG. 6, shows a WLP, semiconductor package, or semiconductor device 100 after disposing encapsulant 52 around conductive pillars 34, after forming of build-up interconnect layer 104 over conductive pillars 34 and encapsulant 53, and after singulating the WLP 100 from its native wafer 20. As shown, the build-up interconnect layer 104 can comprise a conductive layer or RDL 106 that can optionally be formed as a fan-in structure, an insulating layer or passivation layer 107, a UBM 108, and a bump 110, all formed over the semiconductor die 24, the conductive pillars 34, and the encapsulant 53. FIG. 7 also shows the WLP 100 with identifying marks 46 formed in the photosensitive material 40, through the method of marking described in above.

Figure 8:
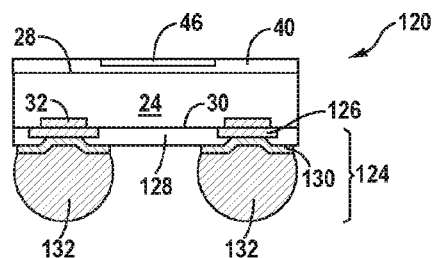
FIG. 8 illustrates an embodiment of a semiconductor package comprising an identifying mark.

FIG. 8 shows a WLP, semiconductor package, or semiconductor device 120 without conductive pillars 34 or 36, and with a build-up interconnect layer 124 formed over conductive the semiconductor die 28 after singulating the WLP 100 from its native wafer 20. As shown, the build-up interconnect layer 104 can comprise a conductive layer or RDL 126 that can optionally be formed as a fan-in structure, an insulating layer or passivation layer 128, a UBM 130, and a bump 132, all formed over the semiconductor die 24. FIG. 8 also shows the WLP 120 with identifying marks 46 formed in the photosensitive material 40, through the method of marking described in above.

Figure 9:
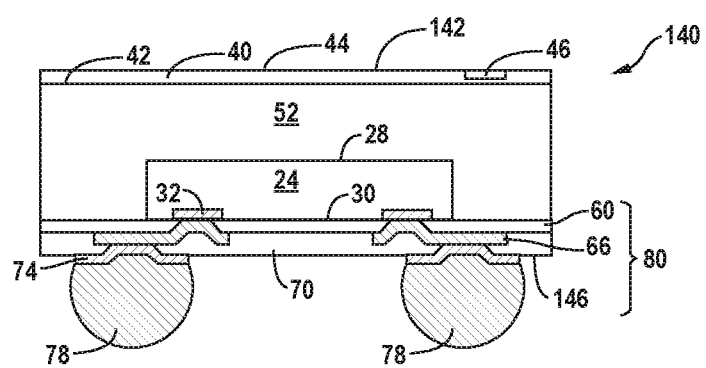
FIG. 9 illustrates an embodiment of a semiconductor package comprising an identifying mark.

FIG. 9 shows a package, semiconductor package, semiconductor device, or fo-WLCSP 140 similar to fo-WLP 82 show in FIG. 3E, but without the conductive pillars 34, and without the encapsulant material 52 disposed between the active surface 30 of the semiconductor die 24 and the build-up interconnect layer 80. As such, a bottom surface of the encapsulant 52 can be coplanar or substantially coplanar with the active surface 30 of the semiconductor die 24. Package 140 also differs from package 82 by not having the photosensitive layer 40 in direct contact with, or on, the backside 28 of semiconductor 24. Instead, the photosensitive layer 40 is offset from the backside 28 by a layer or portion of encapsulant 52. In any event, the fo-WLCSP 140 provides another non-limiting example of how a semiconductor package can comprise identifying marks 46 formed in the photosensitive material 40, through the method of marking described in above, such as in FIGS. 3A-3F.

Figure 10A:
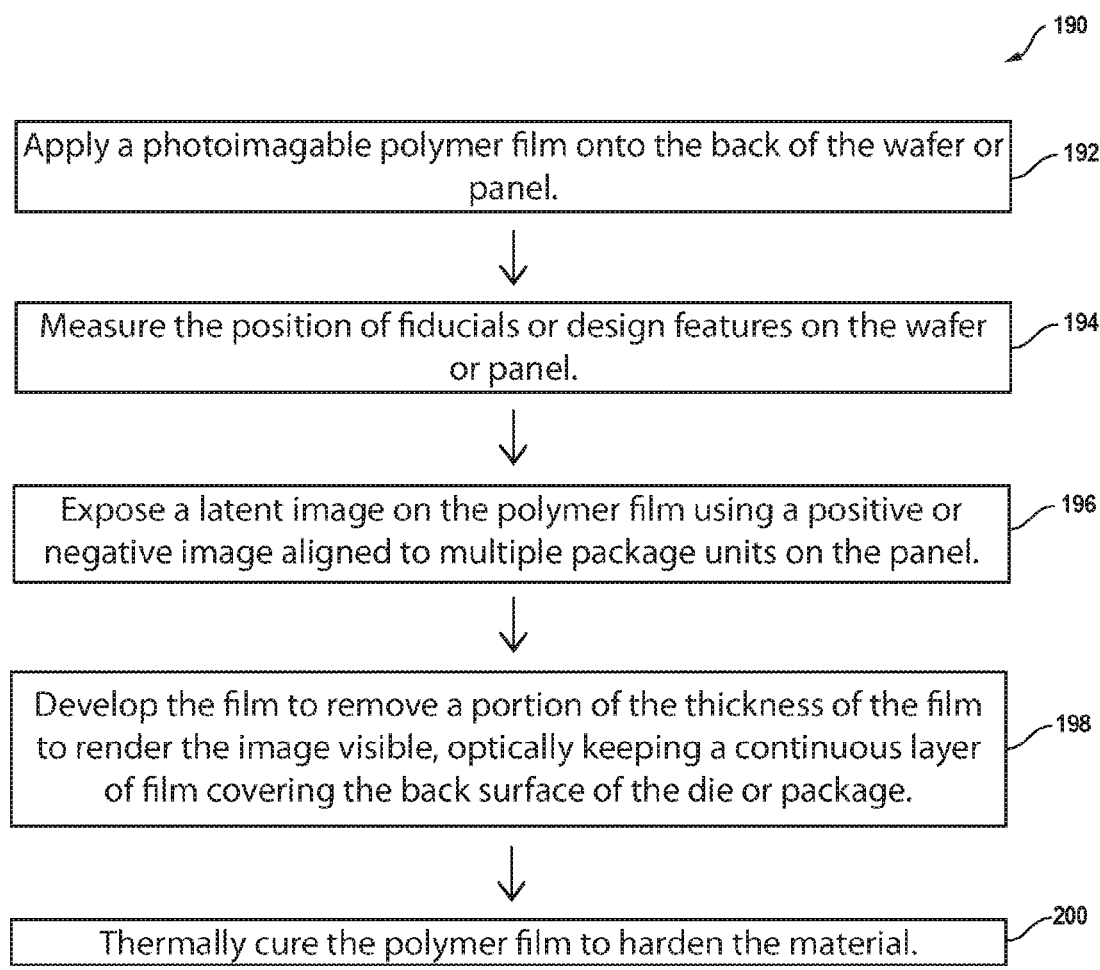
FIGS. 10A and 10B illustrate process flows relating to aspects of semiconductor packages comprising unique identifiers.

FIG. 10A illustrates a process flow 190 for a non-limiting example of forming a unique identifying mark 46 together with, or as part of, the semiconductor die 24 or the semiconductor device 82. As such, the process flow 190 can begin at block 192, in which the photosensitive material 40 or a photoimagable polymer film can be applied to the top surface 58 of the reconstituted waver 50 or at the backside 84 of semiconductor package 82. At block 194, the position of fiducials or design features on a wafer or on the reconstituted wafer 50 can be measured. A design feature on the active surface or bottom surface 56 of the reconstituted waver 50 or at the frontside 86 of semiconductor package 82 can also be used to align the identifying mark 46 or a marking pattern. At block 196, the identifying mark 46 or a latent image can be exposed on the photosensitive material 41 or on a polymer film. The identifying mark 46 can contain the positive or negative image of the identifying mark 46. The identifying mark 46 can be substantially aligned to multiple semiconductor die 24 or semiconductor packages 82 on the reconstituted wafer 50. At block 198, the photosensitive material 40 can be partially or completely developed to remove only a portion, or an entirety, of the thickness of the photosensitive material 40 to render the identifying mark 46 visible. When the photosensitive material 40 is partially developed so that only a portion of the photosensitive material 40 is removed, a contiguous layer of the photosensitive material 40 can be maintained covering the top surface of the semiconductor die 24, the reconstituted wafer 50, or the semiconductor package 82. At block 200, the photosensitive material 40 can be cured, such as by thermal, UV, infrared, or other suitable cure, to harden the photosensitive material 40.

Figure 10B:
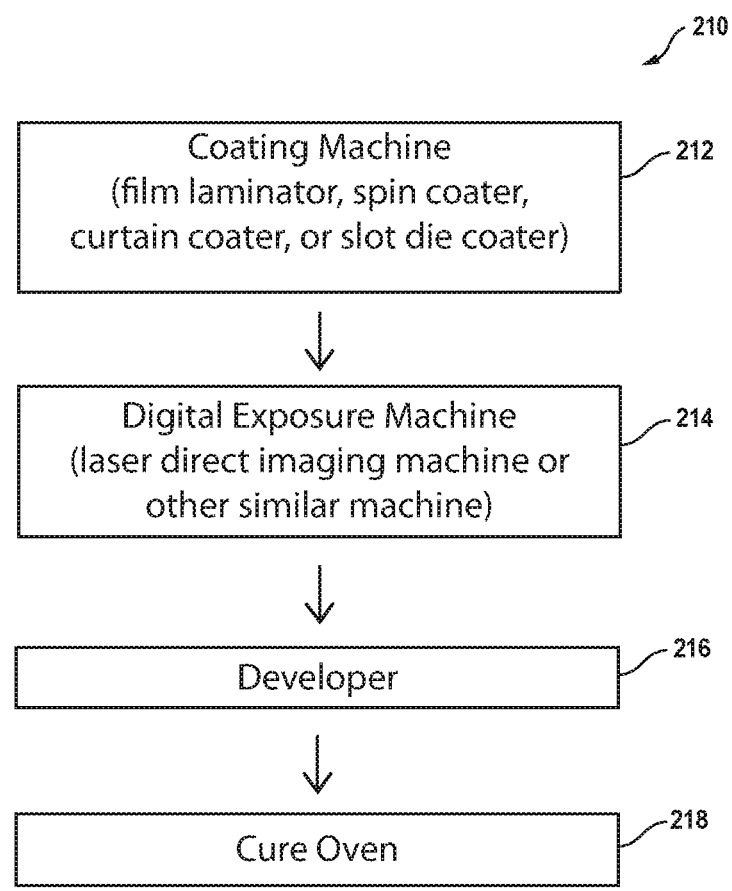

FIG. 10B shows a non-limiting example of a fully integrated manufacturing line 210 that can be used to implement the method or process flow 190. The integrated manufacturing line 210 can comprise of at least a coating machine 212, a digital exposure machine 214, a developer 216, and a cure oven 218, all of which can be linked together such that wafers or panels, such as reconstituted wafer 50, can be processed in a sequential, linear flow through the integrated manufacturing line 210. The coating machine 212 can be a film laminator, spin coater, curtain coater, slot die coater, or other suitable coating machine. The digital exposure machine 214 can be a laser direct imaging machine or other similar machine.

In the case of the coating machine 212 being a film laminator, an additional machine or piece of equipment can be included or inset to remove a cover film that is supplied with the laminating film. The cover film remover can be remove the cover film after exposure of the photosensitive material 40, but could also be done before exposure. A temporal buffer of period of time could be included, inserted, or preserved, between exposure and development of the photosensitive material 40, to allow sufficient time for cross-linking of the photosensitive material 40 between exposure and developing using a negative acting photosensitive material 40. An AOI machine may be inserted after develop and before cure of the photosensitive material 40 in order to assess the quality of the identifying mark 46. This would allow the identifying mark 46 to be reworked if there were any quality problems with the identifying mark 46. Alternately, the AOI machine can be inserted after the cure oven or, could be omitted entirely. The integrated manufacturing line may comprise load ports on each end of the line to facilitate loading and unloading of batches of wafers, whether native wafers 20 or reconstituted wafers 50. The integrated manufacturing line may read one or more identifying marks 46 to identify a wafer or panel ID number for a wafer after unloading the wafer from the loadport and before coating. In some instances, the integrated manufacturing line may use the wafer ID number to call up a marking instruction or file to be executed by the exposure machine.

By implementing the methods of marking semiconductor packages or devices as disclosed herein, human readable and machine readable identifying marks 46 can be formed on the backside of the semiconductor packages, such as packages 82, 87, 100, 120, and 140 through photo imaging and partial development of a photosensitive material 40 to provide a number of advantages. First, the semiconductor package can be produced at increased rate or throughput of greater than 25 WPH for 300 mm WLCSP, which is greater than the throughput of about less than 3 WPH for traditional laser marking on a wafer of similar size. Second, manufacturing cycle time can be reduced as a result of increased throughput. Third, throughput, manufacturing time, or both, can be independent of the number of characters or symbols in the identifying mark 46 marked on the semiconductor package. Fourth, marking resolution of the identifying marks 46 can be increased, so character size can be reduced substantially. Fifth, legibility of the identifying marks 46 can be improved compared to laser ablation, including for logs or similar designs. Sixth, a cost of marking the identifying marks 46 on the semiconductor packages can be reduced compared to laser marking and ink printing. Seventh, using a maskless patterning machine requires no custom tooling, and marking design and content for each of a plurality of semiconductor packages can be accomplished with unique identifying marks 46 for each of the semiconductor packages included within the reconstituted wafer 50. This technique is particularly useful for WLCSPs as well as embedded die or fan-out wafer level packages wherein there can be thousands of units and hundreds of thousands of characters per wafer or panel. Eighth, problems with quality due to variability of laser power can be eliminated. Ninth, rework of the marks 46 is facilitated when the marking does not meet marking standards, such as by removal of photosensitive layer 40, and reapplication of a new photosensitive layer 40 with new marks 46.

While this disclosure includes a number of embodiments in different forms, there is presented in the drawings and written descriptions detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well, without departing from the broader spirit and scope of the inventions as set forth in the appended claims. Accordingly, the disclosed subject matter is to be regarded in an illustrative sense rather than a restrictive sense, and is intended to embrace all such alterations, modifications and variations that fall within the spirit and scope of the disclosure and the knowledge of one of ordinary skill in the art.

What is claimed is:

1. A method of making a semiconductor device, comprising:
    providing a wafer comprising a plurality of semiconductor die, wherein each semiconductor die comprises an active surface and a backside opposite the active surface;
    forming a multi-film material over the wafer and over a backside of each of the plurality of semiconductor die within the wafer with a coating machine, the multi-film material comprising a non-photosensitive layer and a photosensitive layer, wherein a thickness of the photosensitive layer is less than or equal to a thickness of the non-photosensitive layer;
    forming an identifying mark within the photosensitive layer for each of the plurality of semiconductor die by removing a portion of the photosensitive layer with a digital exposure machine and a developer, wherein a thickness of the identifying mark is less than or equal to 50 percent of a thickness of the photosensitive layer, the identifying mark encoding unique product information;
    curing the photosensitive layer; and
    singulating the wafer into a plurality of semiconductor devices.

2. The method of claim 1, wherein the wafer is a native semiconductor wafer.

3. The method of claim 1, wherein the wafer is a reconstituted wafer or reconstituted panel.

4. The method of claim 1, further comprising forming the identifying marks with a feature size less than or equal to 150 micrometers in length, width, or both.

5. The method of claim 1, further comprising:
    forming the photosensitive layer comprising a thickness in a range of 10-60 micrometers; and
    forming the identifying mark for each of the plurality of semiconductor die with a thickness in a range of 2-30 micrometers.

6. The method of claim 1, further comprising forming the photosensitive layer as a multi-film material comprising a non-photosensitive layer and a photosensitive layer, wherein a thickness of the photosensitive layer is less than or equal to a thickness of the non-photosensitive layer.

7. The method of claim 1, further comprising:
    forming the wafer with a diameter of about 300 millimeters; and
    forming the identifying mark for each of the plurality of semiconductor die at a rate equal to or greater than 25 wafers per hour (WPH) for wafers comprising a diameter of about 300 mm.

8. The method of claim 1, wherein the identifying mark comprises one or more features comprising text, letters, shapes, symbols, logos, alphanumeric sequences, two-dimensional matrix codes, bar codes, QR codes, IR codes, or pin identifiers.

9. The method of claim 1, wherein manufacturing time of the identifying mark is independent of a number of characters or symbols in the identifying mark.

\* \* \* \* \*